(12) United States Patent
Jiang

(10) Patent No.: US 11,609,366 B2
(45) Date of Patent: Mar. 21, 2023

(54) FLEXIBLE SUBSTRATE, METHOD OF MANUFACTURING THE SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventor: Zhuolin Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 382 days.

(21) Appl. No.: 16/646,614

(22) PCT Filed: Sep. 6, 2019

(86) PCT No.: PCT/CN2019/104672
§ 371 (c)(1),
(2) Date: Mar. 12, 2020

(87) PCT Pub. No.: WO2020/063296
PCT Pub. Date: Apr. 2, 2020

(65) Prior Publication Data
US 2021/0215862 A1 Jul. 15, 2021

(30) Foreign Application Priority Data
Sep. 25, 2018 (CN) .......................... 201811117004.2

(51) Int. Cl.
*G02B 5/20* (2006.01)
*G02B 1/00* (2006.01)
(Continued)

(52) U.S. Cl.
CPC ............. *G02B 5/206* (2013.01); *G02B 1/005* (2013.01); *H01L 27/3272* (2013.01); *H01L 51/0097* (2013.01); *H01L 2251/5338* (2013.01)

(58) Field of Classification Search
CPC .......... G02B 1/005; G02B 5/206; G02B 5/20; H01L 51/52
See application file for complete search history.

(56) References Cited

U.S. PATENT DOCUMENTS 7,531,786 B2 * 5/2009 Cunningham ........ B01L 3/5085
250/214.1
7,737,392 B2 * 6/2010 Cunningham ....... G01N 21/253
250/573

(Continued)

FOREIGN PATENT DOCUMENTS

CN 1515926 A 7/2004
CN 1622727 A 6/2005
(Continued)

OTHER PUBLICATIONS

International search report of PCT application No. PCT/CN2019/104672 dated Dec. 9, 2019.
(Continued)

*Primary Examiner* — Olga V Merkoulova
(74) *Attorney, Agent, or Firm* — Lippes Mathias LLP

(57) ABSTRACT

The present disclosure discloses a flexible substrate, a method of manufacturing the same, and a display device. The flexible substrate includes a plurality of substrate structure layers that are superimposed, and at least one of the plurality of substrate structure layers includes an organic layer, an inorganic layer and a photonic crystal layer that are superimposed.

17 Claims, 9 Drawing Sheets

(51) Int. Cl.
  *H01L 27/32* (2006.01)
  *H01L 51/00* (2006.01)

(56) References Cited

U.S. PATENT DOCUMENTS

| | | | | |
|---|---|---|---|---|
| 7,968,836 B2* | 6/2011 | Cunningham | ..... | G01N 21/7743 |
| | | | | 250/214.1 |
| 8,008,103 B2* | 8/2011 | Cho | ........................ | H01L 33/60 |
| | | | | 438/42 |
| 8,217,382 B1* | 7/2012 | Ptasinski | .............. | G02B 6/1225 |
| | | | | 385/129 |
| 8,427,747 B2* | 4/2013 | Le | ........................ | B82Y 20/00 |
| | | | | 359/586 |
| 2002/0004307 A1 | 1/2002 | Yamada | | |
| 2005/0116625 A1* | 6/2005 | Park | .................... | H01L 51/5275 |
| | | | | 313/506 |
| 2007/0257269 A1 | 11/2007 | Cho et al. | | |
| 2008/0284320 A1* | 11/2008 | Karkkainen | ......... | G02B 6/1225 |
| | | | | 313/504 |
| 2010/0093123 A1* | 4/2010 | Cho | ........................ | H01L 33/60 |
| | | | | 438/42 |
| 2010/0110551 A1* | 5/2010 | Lamansky | ............. | H05B 33/22 |
| | | | | 359/599 |
| 2010/0151188 A1* | 6/2010 | Ishizuka | ................. | B32B 27/36 |
| | | | | 428/119 |
| 2011/0261461 A1 | 10/2011 | Le et al. | | |
| 2016/0061994 A1 | 3/2016 | Noda et al. | | |
| 2019/0036002 A1 | 1/2019 | Liff et al. | | |

FOREIGN PATENT DOCUMENTS

| | | |
|---|---|---|
| CN | 101071840 A | 11/2007 |
| CN | 102844685 A | 12/2012 |
| CN | 105143923 A | 12/2015 |
| CN | 109273501 A | 1/2019 |
| WO | WO2017171861 A | 10/2017 |

OTHER PUBLICATIONS

First office action of Chinese application No. 201811117004.2 dated Feb. 3, 2020.

* cited by examiner

FLEXIBLE SUBSTRATE, METHOD OF MANUFACTURING THE SAME, AND DISPLAY DEVICE

The present disclosure is a 371 of PCT Patent Application No. PCT/CN2019/104672, filed Sep. 6, 2019, which claims priority to Chinese Patent Application No. 201811117004.2, filed Sep. 25, 2018 and entitled "Flexible substrate, method for manufacturing the same, and display device", the entire contents of which are incorporated herein by reference.

TECHNICAL FIELD

The present disclosure relates to a flexible substrate, a method of manufacturing the same, and a display device.

BACKGROUND

As a new type of flexible panel display devices, active matrix organic light emitting diode (AMOLED) display devices are considered by the industry as display devices with the most potential due to the characteristics of wide color gamut, high contrast, ultra-thinness, flexible display, and the like.

SUMMARY

The present disclosure provides a flexible substrate, a method of manufacturing the same, and a display device. The technical solutions are as follows.

In an aspect, a flexible substrate is provided. The flexible substrate comprises:

a plurality of substrate structure layers that are superimposed, wherein at least one of the plurality of substrate structure layers comprises an organic layer, an inorganic layer and a photonic crystal layer that are superimposed.

Optionally, the photonic crystal layer is a two-dimensional photonic crystal layer.

Optionally, the photonic crystal layer has a plurality of through holes penetrating along a thickness direction of the photonic crystal layer.

Optionally, a shape of an opening surface of the through hole is a circle or a polygon.

Optionally, a shape of the opening surface of the through hole is a circle, and an aperture of the through hole ranges from 10 nm to 1000 nm.

Optionally, the through hole is provided with an organic material.

Optionally, the organic material is same as a material of the organic layer.

Optionally, the organic material is polyimide.

Optionally, materials of the inorganic layer and the photonic crystal layer are both silicon oxide.

Optionally, a surface roughness of the organic layer is less than or equal to 2%, a surface roughness of the inorganic layer is less than or equal to 3%, and a surface roughness of the photonic crystal layer is less than or equal to 3%.

Optionally, the plurality of substrate structure layers comprise: a first substrate structure layer and a second substrate structure layer which are located at outermost sides, wherein the first substrate structure layer comprises the organic layer, the inorganic layer, and the photonic crystal layer that are superimposed, and the second substrate structure layer comprises the organic layer and the inorganic layer that are superimposed.

Optionally, the plurality of substrate structure layers further comprise: a third substrate structure layer located between the first substrate structure layer and the second substrate structure layer, wherein the third substrate structure layer comprises the organic layer, the inorganic layer, and the photonic crystal layer that are superimposed.

Optionally, a thickness of the organic layer ranges from 6 μm to 8 μm, and a thickness of the photonic crystal layer ranges from 100 nm to 300 nm;

thicknesses of the inorganic layers in the first substrate structure layer and in the third substrate structure layer both range from 700 nm to 900 nm, and a thickness of the inorganic layer in the second substrate structure layer ranges from 500 nm to 1500 nm.

Optionally, the plurality of substrate structure layers are two substrate structure layers.

Optionally, the plurality of substrate structure layers are two substrate structure layers and the two substrate structure layers comprise a first substrate structure layer and a second substrate structure layer, the first substrate structure layer comprises the organic layer, the inorganic layer, and the photonic crystal layer that are superimposed, and the second substrate structure layer comprises the organic layer and the inorganic layer that are superimposed;

the photonic crystal layer is a two-dimensional photonic crystal layer, the photonic crystal layer has a plurality of through holes penetrating along a thickness direction of the photonic crystal layer, and polyimide is provided in the through holes, wherein a shape of an opening surface of the through hole is a circle or a polygon, and an aperture of the through hole ranges from 10 nm to 1000 nm when the shape of the opening surface of the through hole is a circle;

a surface roughness of the organic layer is less than or equal to 2%, a surface roughness of the inorganic layer is less than or equal to 3%, and a surface roughness of the photonic crystal layer is less than or equal to 3%;

a thickness of the organic layer ranges from 6 μm to 8 μm, and a thickness of the photonic crystal layer ranges from 100 nm to 300 nm, a thickness of the inorganic layer in the first substrate structure layer ranges from 700 nm to 900 nm, and a thickness of the inorganic layer in the second substrate structure layer ranges from 500 nm to 1500 nm;

materials of the inorganic layer and the photonic crystal layer are both silicon oxide, and a material of the organic layer is polyimide.

In another aspect, a method of manufacturing a flexible substrate is provided. The method comprises:

forming a plurality of substrate structure layers that are superimposed on a base substrate, wherein at least one of the plurality of substrate structure layers comprises an organic layer, an inorganic layer and a photonic crystal layer that are superimposed; and stripping the base substrate to obtain the flexible substrate.

Optionally, forming the plurality of substrate structure layers that are superimposed on the base substrate comprises:

forming an organic layer on the base substrate;

forming an inorganic mother layer on the base substrate on which the organic layer is formed; and processing the inorganic mother layer by a patterning process to obtain an inorganic layer and a photonic crystal layer, the photonic crystal layer having a plurality of through holes penetrating along a thickness direction of the photonic crystal layer, and obtaining a first substrate structure layer.

Optionally, forming the plurality of substrate structure layers that are superimposed on the base substrate further comprises:

filling the through holes of the photonic crystal layer with an organic material.

Optionally, filling the through holes of the photonic crystal layer with the organic material comprises;

forming a second substrate structure layer on the base substrate on which the photonic crystal layer is formed, wherein the second substrate structure layer comprises an organic layer and an inorganic layer that are superimposed in a direction away from the base substrate, and a material of the organic layer is filled in the through holes of the photonic crystal layer.

In still another aspect, a display device is provided. The display device includes a flexible substrate which comprises a plurality of substrate structure layers that are superimposed, and at least one of the plurality of substrate structure layers comprises an organic layer, an inorganic layer and a photonic crystal layer that are superimposed.

the flexible substrate according to any optional implementation in any of the above two aspects.

BRIEF DESCRIPTION OF THE DRAWINGS

In order to describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

Figure 1:
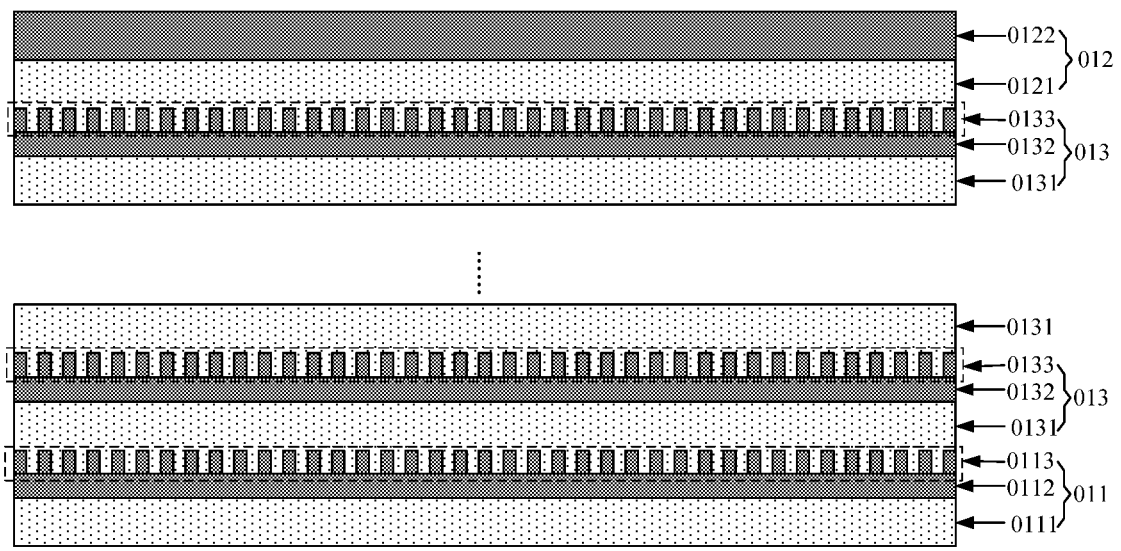
FIG. 1 is a schematic diagram of a structure of a flexible substrate according to an embodiment of the present disclosure.

The accompanying drawings, which are incorporated in and constitute a part of this specification, illustrate embodiments consistent with the present disclosure, and together with the description, serve to explain the principles of the present disclosure.

DETAILED DESCRIPTION

To make the principles, technical solutions and advantages of the present disclosure clearer, the embodiments of the present disclosure will be described below in detail in conjunction with the accompanying drawings. It is obvious that the described embodiments are part rather than all the embodiments of the present disclosure. All other embodiments obtained by those of ordinary skill in the art based on the embodiments of the present disclosure without creative work are within the scope of protection of the present disclosure.

With the rapid development of the display industry, new display technologies, such as full-screen technology and optical fingerprint identification technology, are emerging, and in the display industry, AMOLED display devices are considered by the industry as the display devices with the most potential.

An AMOLED display device includes a flexible substrate, and a backplane circuit, an anode, a hole transport layer, an organic light emitting layer, an electron transport layer, a cathode, and an encapsulation layer that are located on the flexible substrate. A thin film transistor (TFT) in the backplane circuit includes a gate, a gate insulating layer, an active layer, a source and a drain. The source and the drain are respectively in lap joint on the active layer, and the drain is electrically connected to the anode. When the gate controls the TFT to be turned on, the active layer is conducted, and data signals on the source flow to the anode through the active layer and the drain sequentially, such that an electric field is generated between the anode and the cathode. Under the action of the electric field, holes in the anode are injected into the organic light emitting layer through the hole transport layer, and electrons in the cathode are injected into the organic light emitting layer through the electron transport layer, so that holes and electrons recombine in the organic light emitting layer to generate energy, which excites the organic light emitting layer to emit light, thereby enabling the AMOLED display device to realize image display. The active layer is usually formed of a semiconductor material. Under light irradiation, the electrons in a conduction band or an impurity energy band of the semiconductor material are excited to jump into a valence band to conduct the active layer. The TFT may generate a certain leakage current, and the leakage current may be transmitted to the anode to cause the organic light emitting layer to emit light, thereby causing abnormal display of the AMOLED display device.

As known to the inventor, a light shielding film is usually attached to the back of the flexible substrate (that is, a side of the flexible substrate away from the backplane circuit) with a module film attaching method to shield the light and prevent the light from irradiating on the active layer. However, on the one hand, attaching the light shielding film on the back of the flexible substrate may result in a complicated structure of the AMOLED display device; and on the other hand, the light shielding film has a good shielding effect on visible light, but has a poor shielding effect on light having a specific wavelength, such as ultraviolet light and infrared light.

Embodiments of the present disclosure provides a flexible substrate, a method of manufacturing the same, and a display device. The flexible substrate includes a photonic crystal layer having a photonic band gap, and the photonic crystal layer can absorb the light having a specific wavelength and thereby prevent the light from irradiating on the TFT of the display device. In addition, the photonic crystal layer has a good effect of absorbing light having the specific wavelength without the need to attach the light shielding film, which thereby simplifies the structure of the display device. Please refer to the following embodiments for the solution of the present disclosure.

Please refer to FIG. 1, which is a schematic diagram of a structure of a flexible substrate 01 according to an embodiment of the present disclosure. The flexible substrate 01 includes a plurality of substrate structure layers that are superimposed. At least one of the plurality of substrate structure layers includes an organic layer, an inorganic layer and a photonic crystal (PC) layer that are superimposed.

In summary, in the flexible substrate provided in the embodiment of the present disclosure, at least one substrate structure layer includes a photonic crystal layer that has a photonic band gap, and the photonic crystal layer can absorb the light having a wavelength within the photonic band gap. Thus, for a display device with the flexible substrate, there is no need to attach a light shielding film on the back of the flexible substrate, which helps simplify the structure of the display device.

Optionally, as illustrated in FIG. 1, the plurality of substrate structure layers include: a first substrate structure layer 011 and a second substrate structure layer 012 that are located at outermost sides, and a third substrate structure layer 013 located between the first substrate structure layer 011 and the second substrate structure layer 012. The first substrate structure layer 011 includes an organic layer 0111, an inorganic layer 0112, and a photonic crystal layer 0113 that are superimposed. The second substrate structure layer 012 includes an organic layer 0121 and an inorganic layer 0122 that are superimposed. The third substrate structure layer 013 includes an organic layer 0131, an inorganic layer 0132, and a photonic crystal layer 0133 that are superimposed. The number of the third substrate structure layer 013 may be greater than or equal to 1. For example, the number of the third substrate structure layer 013 is two. As illustrated in FIG. 1, the organic layer 0111, the inorganic layer 0112, and the photonic crystal layer 0113 are sequentially superimposed in a direction close to the second substrate structure layer 012; the organic layer 0121 and the inorganic layer 0122 are sequentially superimposed in a direction away from the first substrate structure layer 011; and the organic layer 0131, the inorganic layer 0132 and the photonic crystal layer 0133 are sequentially superimposed in a direction away from the first substrate structure layer 011.

Figure 2:
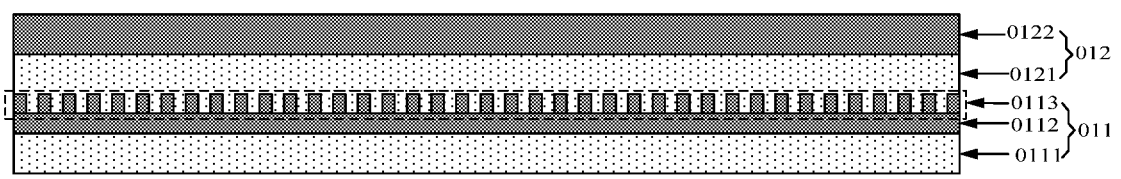
FIG. 2 is a schematic diagram of a structure of another flexible substrate according to an embodiment of the present disclosure.

Optionally, reference is made to FIG. 2, which is a schematic diagram of a structure of another flexible substrate 01 according to an embodiment of the present disclosure. As illustrated in FIG. 2, the plurality of substrate structure layers is two substrate structure layers that include a first substrate structure layer 011 and a second substrate structure layer 012. The first substrate structure layer 011 includes an organic layer 0111, an inorganic layer 0112, and a photonic crystal layer 0113 superimposed in a direction close to the second substrate structure layer 012, and the second substrate structure layer 012 includes an organic layer 0121 and an inorganic layer 0122 superimposed in a direction away from the first substrate structure layer 011. It is easy to understand that FIG. 1 and FIG. 2 are merely exemplary. In practical applications, the second substrate structure layer 012 may also include a photonic crystal layer, which is not limited in the embodiment of the present disclosure.

Optionally, the photonic crystal layer is a two-dimensional photonic crystal layer, and the photonic crystal layer has a plurality of through holes penetrating in the thickness direction of the photonic crystal layer. The shape of the opening surface of each of the plurality of through holes is a circle or a polygon, and the polygon may be any polygon such as a triangle, a quadrangle, a pentagon, and a hexagon. Optionally, the shape of the opening surface of each through hole is circle, and the aperture of each through hole may range from 10 nm to 1000 nm (nanometer). The shape of the opening surface of the through hole and the aperture of the through hole may be determined according to the photonic band gap that the photonic crystal layer needs to meet. For example, when the shape of the opening surface of the through hole is a circle, the aperture of the through hole may be 15 nm, 20 nm, 100 nm, 200 nm, 500 nm, etc. Optionally, in the photonic crystal layer, each through hole is provided with an organic material. The organic material in the through hole may be the same as the material of the organic layer. For example, the organic material in the through hole may be polyimide (PI). Persons of ordinary skill in the art may easily understand that the text is illustrated by taking an example in which the photonic crystal layer is a two-dimensional photonic crystal layer. The photonic crystal layer may also be a one-dimensional photonic crystal layer or a three-dimensional photonic crystal layer. The photonic crystal layer described in this paragraph may be a photonic crystal layer 0113 or any photonic crystal layer 0133. The structure of the photonic crystal layer 0113 and the structure of the photonic crystal layer 0133 may be the same or different, which is not limited in the embodiment of the present disclosure.

Figure 3:
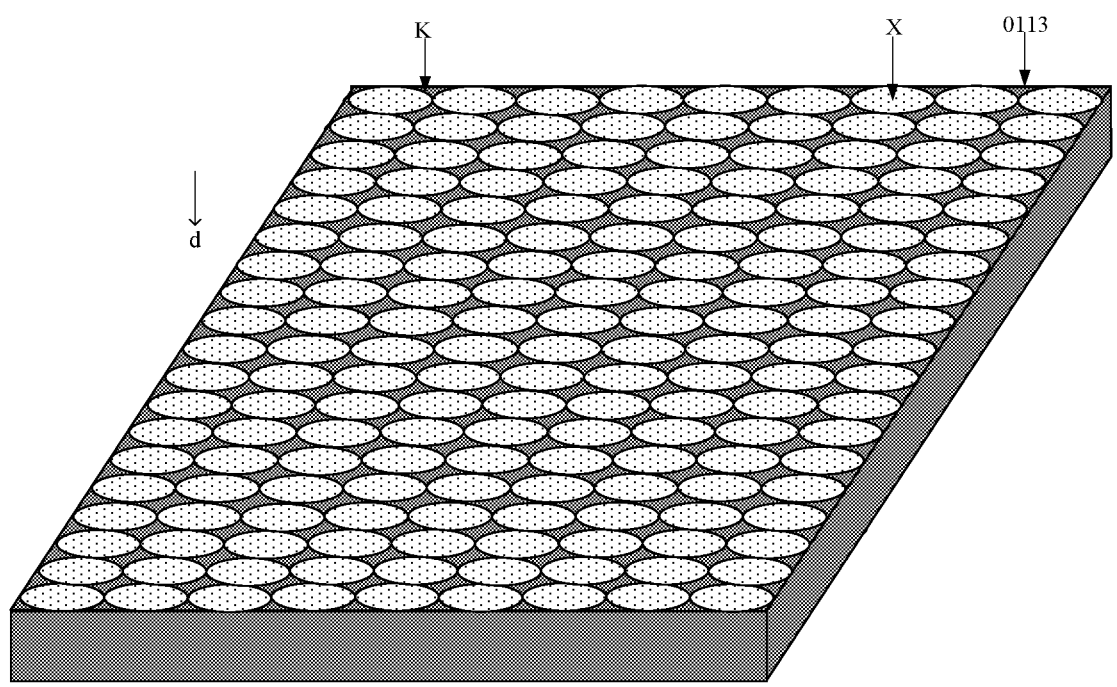
FIG. 3 is a schematic diagram of a three-dimensional structure of a photonic crystal layer according to an embodiment of the present disclosure.
Figure 4:
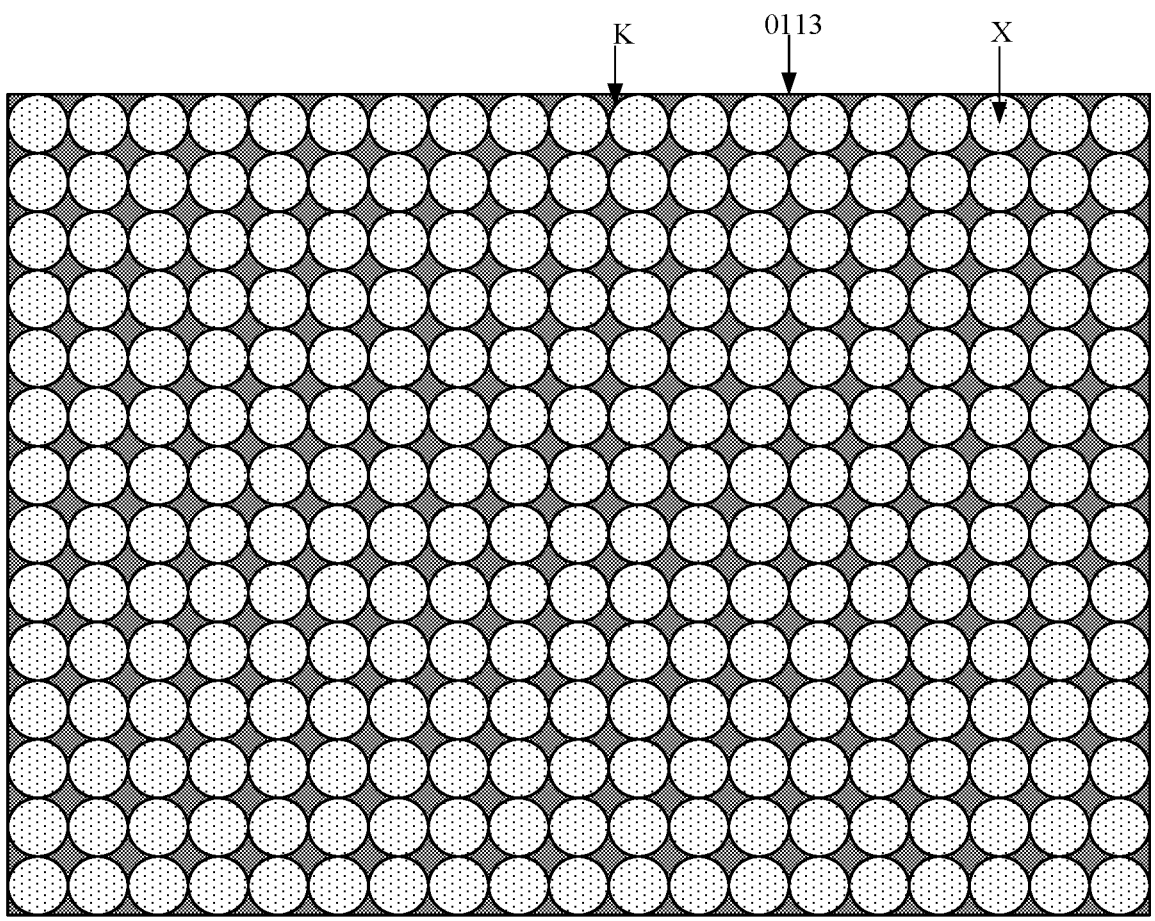
FIG. 4 is a front view of a photonic crystal layer according to an embodiment of the present disclosure.

Optionally, FIG. 3 is a schematic diagram of a three-dimensional structure of a photonic crystal layer according to an embodiment of the present disclosure, and FIG. 4 is a front view of a photonic crystal layer according to an embodiment of the present disclosure. FIG. 3 and FIG. 4 are both illustrated by taking the photonic crystal layer 0113 as an example. The photonic crystal layer 0113 has a plurality of through holes K penetrating along the thickness direction d of the photonic crystal layer 0113. The shape of the opening surface of each through hole K is a circle, and each through hole K is provided with an organic material X, which may be PI. Persons of ordinary skill in the art may easily understand that FIG. 3 and FIG. 4 are illustrated by taking an example in which the shape of the opening surface of the through hole K in the photonic crystal layer 0113 is a circle. When the shape of the opening surface of the through hole is a polygon, the structure of the photonic crystal layer 0113 may be referred to FIG. 3 and FIG. 4, and is not repeated in the embodiment of the present disclosure.

Optionally, the material of the organic layer may be PI, and the material of the inorganic layer and the material of the photonic crystal layer may both be silicon oxide ($SiO_x$), for example, $SiO_2$. Optionally, the material of the organic layer may also be other organic materials, and the material of the inorganic layer may also be other inorganic materials such as silicon nitride, which is not limited in the embodiment of the present disclosure. The organic layer described in this paragraph may be the organic layer 0111, the organic layer 0121, or any organic layer 0131, and the inorganic layer may be the inorganic layer 0112, the inorganic layer 0122, or any inorganic layer 0132.

Optionally, in the embodiment of the present disclosure, the thickness of the organic layer may range from 6 μm to 8 μm (microns); the thickness of the photonic crystal layer may range from 100 nm to 300 nm; the thickness of the inorganic layer 0112 and each of the inorganic layers 0132 may range from 700 nm to 900 nm; and the thickness of the inorganic layer 0121 may range from 500 nm to 1500 nm. Exemplarily, the thickness of the organic layer 0111 is 8.0 the thickness of the photonic crystal layer 0113 is 200 nm, the thickness of the inorganic layer 0112 is 800 nm, the thickness of the inorganic layer 0131 is 850 nm, and the thickness of the inorganic layer 0121 is 1200 nm. Optionally, a surface roughness of any one of the organic layers may be less than or equal to 2%, a surface roughness of any one of the inorganic layers may be less than or equal to 3%, and a surface roughness of any one of the photonic crystal layers may be less than or equal to 3%. For example, the surface roughness of the organic layer 0111 is 1%, the surface roughness of the inorganic layer 0112 is 2%, and the surface roughness of the photonic crystal layer 0113 is 2%. The surface roughness herein is used to measure the uniformity of the surface. The greater the surface roughness, the worse the uniformity of the surface; and the smaller the surface roughness, the better the uniformity of the surface.

In the embodiment of the present disclosure, the material of the photonic crystal layer may be $SiO_2$, and the through holes of the photonic crystal layer are filled with an organic material, which may be PI. Thus, the photonic crystal layer has an optical modulated microstructure of two different dielectric materials of $SiO_2$ and PI, which vary with spatial periodicity. The dielectric constant of $SiO_2$ is different from that of PI. When the light passes through the photonic crystal layer, Bragg scattering may occur on the interface of the two different dielectric materials of $SiO_2$ and PI, such that the photonic crystal layer has a photonic band gap. The photonic band gap of the photonic crystal layer makes the photonic crystal layer inhibit photons within a specific wavelength range from propagating in certain dimensions of the photonic crystal layer, so that the photonic crystal layer can absorb the light within the specific wavelength range. As found in researches, the photonic crystal layer also has a slow light effect (the slow light effect refers to the phenomenon that the group velocity of photons having the wavelength in the photonic band gap of the photonic crystal layer reduces when the photons propagate in the photonic crystal layer). In the embodiment of the present disclosure, any two photonic crystal layers may have the same or different structures; the opening surfaces of the through holes in any two photonic crystal layers may have the same or different shapes; the through holes in any two photonic crystal layers may have equal or different apertures; and any two photonic crystal layers may have the same or different photonic band gaps. When all the photonic crystal layers in the flexible substrate 01 have the same photonic band gap, the photonic band gap of any one of the photonic crystal layers is also the photonic band gap of the flexible substrate 01. When any two photonic crystal layers in the flexible substrate 01 have different photonic band gaps, the combination of photonic band gaps in different photonic crystal layers forms the photonic band gap of the flexible substrate 01. It is easy to understand that when any two photonic crystal layers in the flexible substrate 01 have different photonic band gaps, the flexible substrate 01 may have a wider photonic band gap, so that the flexible substrate 01 can absorb light within a larger wavelength range. The photonic band gap of the photonic crystal layer may be controlled by controlling the shape of the opening surface of the through hole and the aperture of the through hole in the photonic crystal layer. The photonic band gap of the photonic crystal layer may be determined according to the wavelengths of the light to be absorbed, to determine the shape of the opening surface and the aperture of the through hole in the photonic crystal layer, which is not repeated in the embodiment of the present disclosure.

Figure 5:
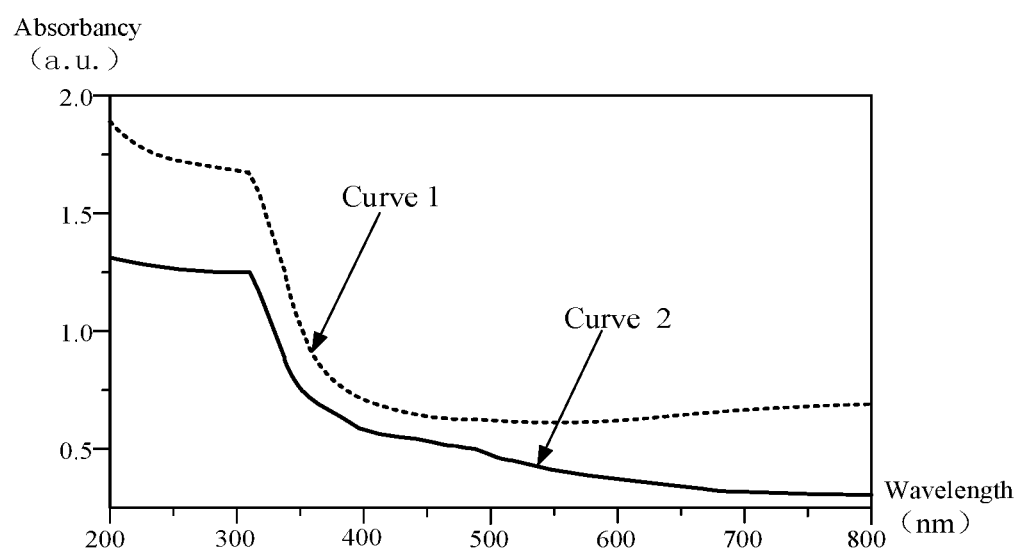
FIG. 5 is a comparison diagram of absorption spectra of a photonic crystal layer according to an embodiment of the present disclosure.

As known to the inventor, in the display device, a light shielding film is usually attached to the back of the flexible substrate to shield light. However, the light shielding film only shields visible light and cannot shield light having a specific wavelength, such as ultraviolet light and infrared light. In the embodiment of the present disclosure, the photonic band gap of the photonic crystal layer may be determined according to the wavelength of the light to be absorbed, so that a photonic crystal layer capable of absorbing the light having the specific wavelength can be manufactured. In the embodiment of the present application, the photonic crystal layer is made of $SiO_2$. Compared with a flat film layer made of $SiO_2$, the photonic crystal layer made of $SiO_2$ can better absorb the light having the specific wavelength. Exemplarily, FIG. 5 is a comparison diagram of absorption spectra of a photonic crystal layer according to an embodiment of the present disclosure. As illustrated in FIG. 5, curve 1 represents the absorption intensity of the photonic crystal layer made of $SiO_2$ for the light having a wavelength in the range of 200 nm to 800 nm, and curve 2 represents the absorption intensity of the flat film layer made of $SiO_2$ for the light having a wavelength in the range of 200 nm to 800 nm. It can be seen that the photonic crystal layer made of $SiO_2$ has a higher absorption intensity for the light having the wavelength in the range of 200 nm to 800 nm, and especially has a higher absorption intensity for ultraviolet light (having a wavelength in the range of 100 nm to 400 nm).

Figure 6:
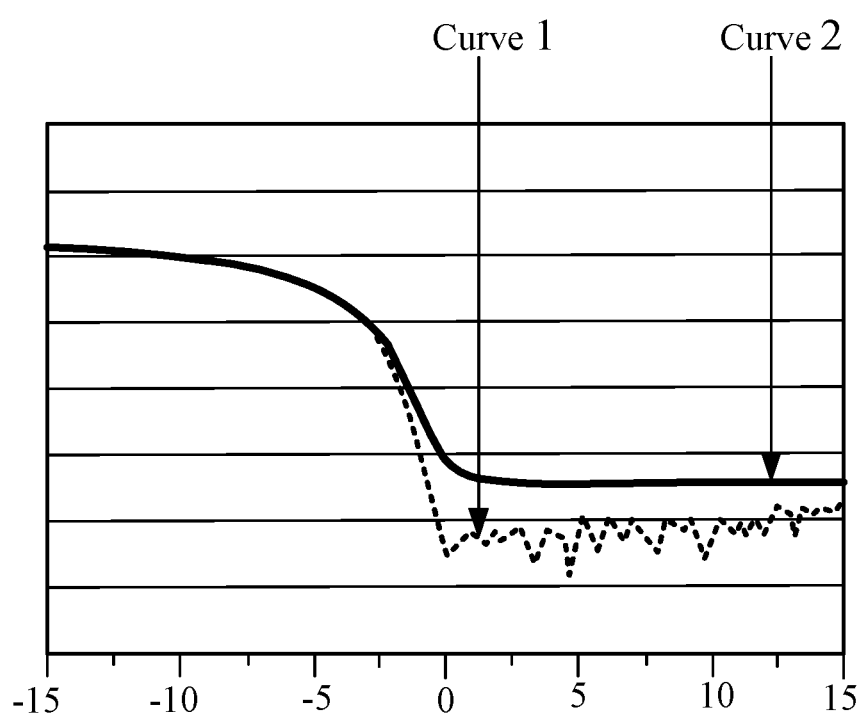
FIG. 6 is a comparison diagram of TFT characteristic curves before and after illumination according to an embodiment of the present disclosure.

As known to the inventor, when the TFT in the AMOLED display device is illuminated, the active layer of the TFT is conducted, resulting in drift of the characteristic curve to affect the optical stability of the backplane circuit of the AMOLED display device. Thus, the AMOLED display device displays abnormally. Exemplarily, FIG. 6 is a comparison diagram of TFT characteristic curves before and after illumination according to an embodiment of the present disclosure. As illustrated in FIG. 6, the horizontal axis represents the gate voltage of the TFT, the vertical axis represents the leakage current of the TFT, curve 1 shows the characteristics of the TFT when it's not illuminated, and curve 2 shows the characteristics of the TFT when it's illuminated. It can be seen that the characteristic curve of the TFT drifts when illuminated. In the embodiment of the present disclosure, the photonic crystal layer of the flexible substrate can absorb the light having the wavelength in the photonic band gap. Thus, when the flexible substrate is applied to the AMOLED display device, light can be prevented from irradiating on the TFT, such that the drift of the characteristic curve of the TFT is avoided, which ensures the optical stability of the TFT and the optical stability of the backplane circuit of the AMOLED display device, thereby preventing the AMOLED display device from displaying abnormally.

In summary, in the flexible substrate provided in the embodiment of the present disclosure, at least one substrate structure layer includes a photonic crystal layer, which has a photonic band gap, and the photonic crystal layer can absorb light having a wavelength in the photonic band gap. Thus, for a display device having the flexible substrate, there is no need to attach a light shielding film on the back of the flexible substrate, which helps simplify the structure of the display device. The flexible substrate provided in the embodiment of the present application can be applied to an AMOLED display device, and is particularly suitable for the AMOLED display device which is full-screen transparent or partial-screen transparent. The photonic crystal layer provided in the embodiment of the present disclosure has an optical modulated microstructure, which enables the photonic crystal layer to have higher mechanical toughness. When the flexible substrate including the photonic crystal layer is applied to an AMOLED display device, the mechanical reliability and the bending resistance of the AMOLED display device can be improved.

The flexible substrate provided in the embodiment of the present application may be applied to the following methods. For the method of manufacturing the flexible substrate and the manufacturing principle thereof in the embodiment of the present disclosure, please refer to descriptions in the following embodiments.

Figure 7:
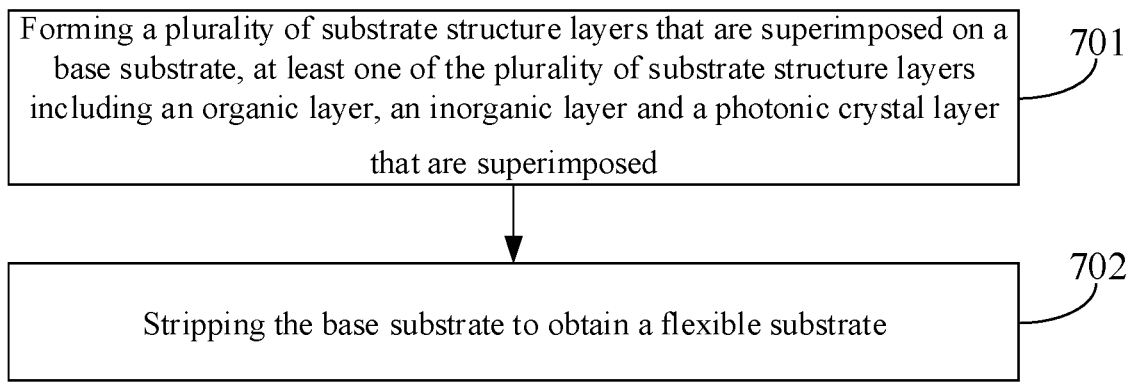
FIG. 7 is a flow chart of a method of manufacturing a flexible substrate according to an embodiment of the present disclosure.

Reference is made to FIG. 7, which is a flow chart of a method of manufacturing a flexible substrate according to an embodiment of the present disclosure. The method of manufacturing the flexible substrate may be used to manufacture the flexible substrate 01 illustrated in FIG. 1 or FIG. 2. Referring to FIG. 7, the method may include following steps.

In step 701, a plurality of substrate structure layers that are superimposed are formed on a base substrate. At least one of the plurality of substrate structure layers includes an organic layer, an inorganic layer and a photonic crystal layer that are superimposed.

In step 702, the base substrate is stripped to obtain a flexible substrate.

In summary, according to the method of manufacturing the flexible substrate provided in the embodiment of the present disclosure, at least one substrate structure layer in the flexible substrate includes a photonic crystal layer that has a photonic band gap, and the photonic crystal layer can absorb light having a wavelength in the photonic band gap. Thus, for a display device having the flexible substrate, there is no need to attach a light shielding film on the back of the flexible substrate, which helps simplify the structure of the display device.

Optionally, step 701 includes: forming an organic layer on the base substrate; forming an inorganic mother layer on the base substrate on which the organic layer is formed; and processing the inorganic mother layer by a patterning process to obtain an inorganic layer and a photonic crystal layer, so as to obtain a first substrate structure layer, the photonic crystal layer having a plurality of through holes penetrating along a thickness direction of the photonic crystal layer.

Optionally, step 701 further includes: filling the through holes of the photonic crystal layer with an organic material.

Optionally, filling the through holes of the photonic crystal layer with the organic material includes: forming a second substrate structure layer on the base substrate on which the photonic crystal layer is formed. The second substrate structure layer includes the organic layer and the inorganic layer superimposed in a direction away from the base substrate, and the material of the organic layer is filled in the through holes of the photonic crystal layer.

All the above optional technical solutions may be combined arbitrarily to form optional embodiments of the present disclosure, and will not be described again in detail.

Figure 8:
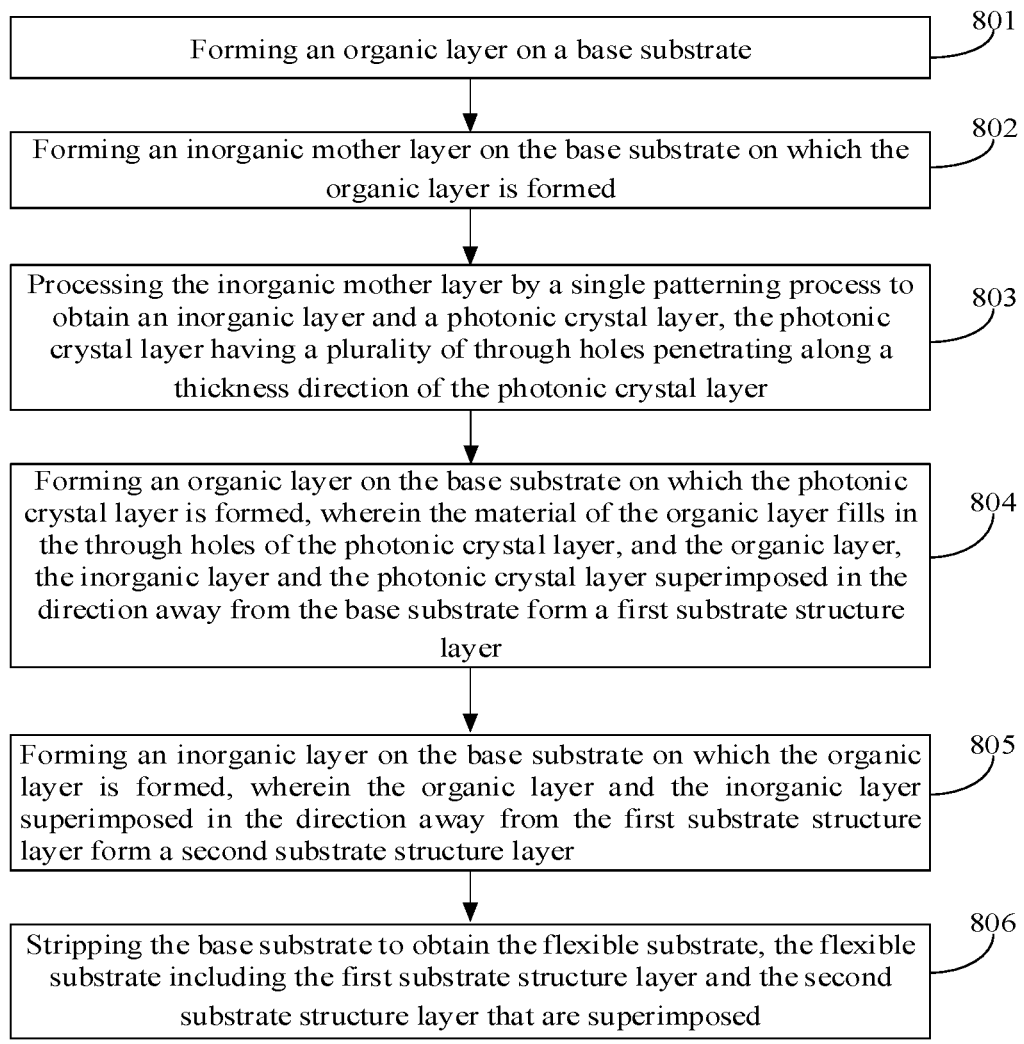
FIG. 8 is a flow chart of a method of manufacturing another flexible substrate according to an embodiment of the present disclosure.

Reference is made to FIG. 8, which is a flow chart of a method of manufacturing another flexible substrate according to an embodiment of the present disclosure. The method of manufacturing the flexible substrate may be used to manufacture the flexible substrate 01 illustrated in FIG. 1 or FIG. 2. This embodiment is illustrated by taking the manufacturing of the flexible substrate 01 illustrated in FIG. 2 as an example. For the method of manufacturing the flexible substrate 01 provided in the embodiment illustrated in FIG. 1, please refer to this embodiment. Referring to FIG. 8, the method may include following steps.

In step 801, an active layer is formed on a base substrate.

Figure 9:
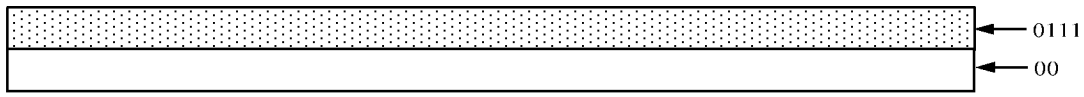
FIG. 9 is a schematic diagram after forming an organic layer on a base substrate according to an embodiment of the present disclosure.

Reference is made to FIG. 9, which is a schematic diagram after forming an organic layer 0111 on a base substrate 00 according to an embodiment of the present disclosure. The base substrate 00 may be a transparent substrate, which may be a rigid substrate made of light-guiding and non-metallic materials that have a certain rigidity, such as glass, quartz, or transparent resin. The material of the organic layer 0111 may be PI, the thickness of the organic layer 011 may range from 6 µm to 8 µm, and the surface roughness of the organic layer 011 may be less than or equal to 2%.

Exemplarily, the PI material layer may be obtained by depositing a layer of PI having a thickness of 6 µm to 8 µm on the base substrate 00 through any one of the processes such as ink-jet printing, magnetron sputtering, thermal evaporation or plasma enhanced chemical vapor deposition (PECVD), and the PI material layer serves as the organic layer 0111. It is easy to understand that when the organic layer 0111 has a graphic, the PI material layer may also be processed through a patterning process, which is not described again in this embodiment.

In step 802, an inorganic mother layer is formed on the base substrate on which the organic layer is formed.

Figure 10:
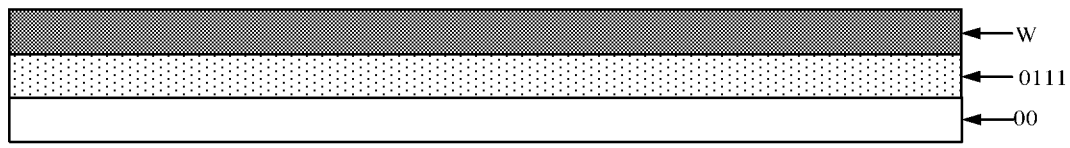
FIG. 10 is a schematic diagram after forming an inorganic mother layer on a base substrate on which an organic layer is formed according to an embodiment of the present disclosure.

Reference is made to FIG. 10, which is a schematic diagram after forming an inorganic mother layer on the base substrate 00 on which the organic layer 0111 is formed according to an embodiment of the present disclosure. The material of the inorganic mother layer W may be $SiO_x$, and the thickness of the inorganic mother layer W may range from 800 nm to 1200 nm.

Exemplarily, the $SiO_x$ material layer may be obtained by depositing a layer of $SiO_x$ having a thickness of 800 nm to 1200 nm on the base substrate 00 on which the organic layer 0111 is formed through any one of the processes such as ink-jet printing, magnetron sputtering, thermal evaporation or PECVD, and the $SiO_x$ material layer serves as the inorganic mother layer W.

In step 803, the inorganic mother layer is processed by a single patterning process to obtain an inorganic layer and a photonic crystal layer, and the photonic crystal layer has a plurality of through holes penetrating along a thickness direction of the photonic crystal layer.

Figure 11:
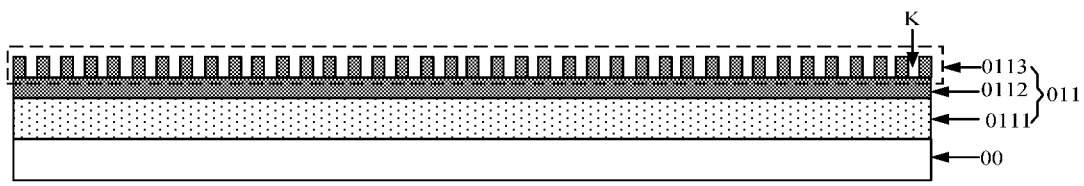
FIG. 11 is a schematic diagram after processing an inorganic mother layer by a patterning process according to an embodiment of the present disclosure.

Reference is made to FIG. 11, which is a schematic diagram after processing the inorganic mother layer W by a single patterning process according to an embodiment of the present disclosure. Referring to FIG. 11, an inorganic layer 0112 and a photonic crystal layer 0113 are obtained by processing the inorganic mother layer W by a single patterning process. The photonic crystal layer 0113 has a plurality of through holes K penetrating along the thickness direction (not marked in FIG. 11) of the photonic crystal layer 0113. The shape of the opening surface of the through hole K may be a circle or a polygon. When the shape of the opening surface of the through hole is a circle, the aperture of the through hole may range from 10 nm to 1000 nm, and may be determined according to the photonic band gap that the photonic crystal layer 0113 needs to meet. The thickness of the inorganic layer 0112 ranges from 700 nm to 900 nm, and the surface roughness of the inorganic layer 0112 may be less than or equal to 3%. The thickness of the photonic crystal layer 0113 ranges from 100 nm to 300 nm, and the surface roughness of the photonic crystal layer 0113 may be less than or equal to 3%.

The single patterning process may include: photoresist coating, exposure, development, etching, and photoresist stripping. Thus, processing the inorganic mother layer W by the single patterning process may include: coating a layer of photoresist on the inorganic mother layer W, exposing the photoresist with a mask, such that the photoresist forms a fully exposed area and a non-exposed area; processing the exposed photoresist by the development process to completely remove the photoresist in the fully exposed area and retain all the photoresist in the non-exposed area; etching the area corresponding to the fully exposed area on the inorganic mother layer W to a depth of 100 nm to 300 nm by a semi-etching process to form the through holes K, and then stripping the photoresist in the non-exposure area. The unetched layer on the inorganic mother layer W is the inorganic layer 0112, and the etched layer is the photonic crystal layer 0113. The thickness of the photonic crystal layer 0113 is equal to the depth of the through hole K.

It is easy to understand that the embodiment of the present disclosure is illustrated by taking an example in which the inorganic layer 0112 and the photonic crystal layer 0113 are formed by the same process. Optionally, the inorganic layer 0112 and the photonic crystal layer 0113 may be respectively formed by one process. Thus, the alternative steps of steps 802 and 803 may be as follows.

In step 802a, the inorganic layer is formed on the base substrate on which the organic layer is formed.

In step 803a, the photonic crystal layer is formed on the base substrate on which the inorganic layer is formed.

Step 802a may include: depositing a layer of $SiO_x$ having a thickness of 700 nm to 900 nm on the base substrate 00 on which the organic layer 0111 is formed through any one of the processes such as ink-jet printing, magnetron sputtering, thermal evaporation or PECVD to obtain the $SiO_x$ material layer, and the $SiO_x$ material layer serves as the inorganic layer 0112.

Step 803a may include: depositing a layer of $SiO_x$ having a thickness of 100 nm to 300 nm on the base substrate 00 on which the inorganic layer 0112 is formed through any one of the processes such as ink-jet printing, magnetron sputtering, thermal evaporation or PECVD to obtain the $SiO_x$ material layer, and then processing the $SiO_x$ material layer by a single patterning process to obtain the photonic crystal layer 0113. Processing the $SiO_x$ material layer by a single patterning process includes: coating a layer of photoresist on the $SiO_x$ material layer, and exposing the photoresist with a mask, such that the photoresist forms a fully exposed area and a non-exposed area; processing the exposed photoresist by the development process to completely remove the photoresist in the fully exposed area and retain all the photoresist in the non-exposed area; etching the area corresponding to the fully exposed area on the $SiO_x$ material layer by an etching process to form the through holes K; and stripping the photoresist in the non-exposure area at last.

In step 804, the organic layer is formed on the base substrate on which the photonic crystal layer is formed. The material of the organic layer is filled in the through holes of the photonic crystal layer. The organic layer, the inorganic layer and the photonic crystal layer superimposed in the direction away from the base substrate form the first substrate structure layer.

Figure 12:
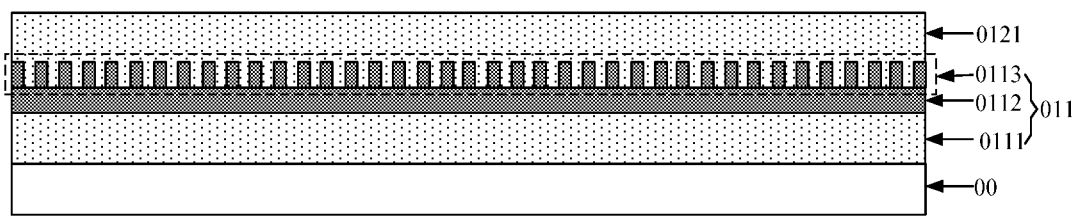
FIG. 12 is a schematic diagram after forming an organic layer on a base substrate on which a photonic crystal layer is formed according to an embodiment of the present disclosure.

Reference is made to FIG. 12, which is a schematic diagram after forming the organic layer 0121 on the base substrate 00 on which the photonic crystal layer 0113 is formed according to an embodiment of the present disclosure. Referring to FIG. 12, the material of the organic layer 0121 is filled in the through holes K of the photonic crystal layer 0113. The material of the organic layer 0121 may be PI, the thickness of the organic layer 0121 may range from 6 μm to 8 μm, and the surface roughness of the organic layer 0121 may be less than or equal to 2%. The process of forming the organic layer 0121 may be made reference to the process of forming the organic layer 0111 in step 801, and is not described again in this embodiment.

Persons of ordinary skill in the art may easily understand that in the embodiment of the disclosure, filling the organic material in the through holes K of the photonic crystal layer 0113 in the process of forming the organic layer 0121 can simplify the manufacturing process of the flexible substrate. Alternatively, the step of filling the organic material in the through holes K of the photonic crystal layer 0113 and the step of forming the organic layer 0121 may be performed separately. Optionally, the organic material may be filled in the through holes K of the photonic crystal layer 0113 firstly, and then the organic layer 0121 is formed on the photonic crystal layer 0113 filled with the organic material.

In step 805, the inorganic layer is formed on the base substrate on which the organic layer is formed. The organic layer and the inorganic layer superimposed in the direction away from the first substrate structure layer form the second substrate structure layer.

Figure 13:
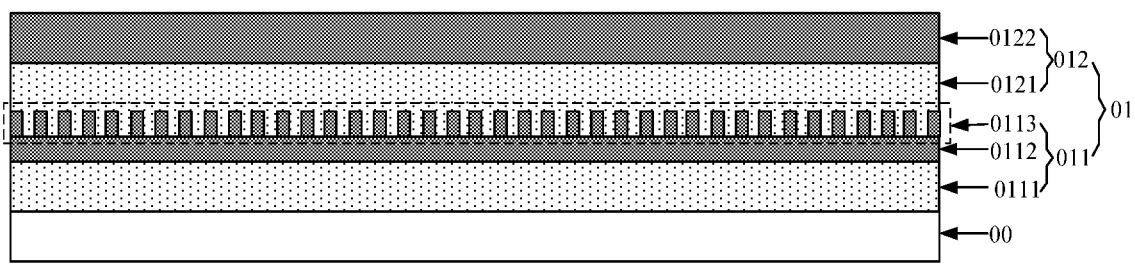
FIG. 13 is a schematic diagram after forming an inorganic layer on a base substrate on which an organic layer is formed according to an embodiment of the present disclosure.

Reference is made to FIG. 13, which is a schematic diagram after forming the inorganic layer 0122 on the base substrate 00 on which the organic layer 0122 is formed according to an embodiment of the present disclosure. The material of the inorganic layer 0122 may be $SiO_x$, the thickness of the inorganic layer 0122 ranges from 500 nm to 1500 nm, and the surface roughness of the inorganic layer 0122 may be less than or equal to 3%. The process of forming the inorganic layer 0122 may be made reference to the process of forming the inorganic mother layer W in step 802, and is not described again in this embodiment.

In step 806, the base substrate is stripped to obtain the flexible substrate. The flexible substrate includes the first substrate structure layer and the second substrate structure layer that are superimposed.

Optionally, the base substrate 00 may be stripped by adopting a laser stripping process, and the flexible substrate 01 may be obtained after the base substrate 00 is stripped. The flexible substrate 01 includes the first substrate structure layer 011 and the second substrate structure layer 012 that are superimposed. Please refer to FIG. 2 for the schematic diagram of the flexible substrate 01.

In summary, according to the method of manufacturing the flexible substrate provided in the embodiment of the present disclosure, at least one substrate structure layer in the flexible substrate includes a photonic crystal layer that has a photonic band gap, and the photonic crystal layer can absorb light having a wavelength in the photonic band gap. Thus, for a display device having the flexible substrate, there is no need to attach a light shielding film on the back of the flexible substrate, which helps simplify the structure of the display device.

Based on the same inventive concept, an embodiment of the present disclosure further provides a display device. The display device includes the flexible substrate 01 according to the aforesaid embodiments. The display device provided by the embodiment of the present disclosure may be any product or component having a display function, such as an OLED display substrate, an OLED panel, an OLED display device, an electronic paper, a mobile phone, a tablet computer, a TV, a display, a notebook computer, a digital photo frame, and a navigator etc.

Optionally, the flexible substrate 01 includes a plurality of substrate structure layers that are superimposed, and at least one of the plurality of substrate structure layers includes an organic layer, an inorganic layer and a photonic crystal layer that are superimposed.

Optionally, the photonic crystal layer is a two-dimensional photonic crystal layer.

Optionally, the photonic crystal layer has a plurality of through holes penetrating along a thickness direction of the photonic crystal layer. A shape of an opening surface of the through hole is a circle or a polygon, and an aperture of the through hole ranges from 10 nm to 1000 nm when the shape of the opening surface of the through hole is a circle.

Optionally, the through holes are provided with an organic material, and the organic material is the same as that of the organic layer.

Optionally, the organic material is polyimide.

Optionally, the materials of the inorganic layer and the photonic crystal layer are both silicon oxide.

Optionally, a surface roughness of the organic layer is less than or equal to 2%, a surface roughness of the inorganic layer is less than or equal to 3%, and a surface roughness of the photonic crystal layer is less than or equal to 3%.

As illustrated in FIG. 1, the plurality of substrate structure layers includes: a first substrate structure layer 011 and a second substrate structure layer 012 which are located at outermost sides. The first substrate structure layer includes the organic layer 0111, the inorganic layer 0112, and the photonic crystal layer 0113 that are superimposed, and the second substrate structure layer 012 includes the organic layer 0121 and the inorganic layer 0122 that are superimposed.

Optionally, as illustrated in FIG. 1, the plurality of substrate structure layers further includes: a third substrate structure layer 013 located between the first substrate structure layer 011 and the second substrate structure layer 012. The third substrate structure layer 013 includes the organic layer 0131, the inorganic layer 0132, and the photonic crystal layer 0133 that are superimposed.

Optionally, a thickness of the organic layer ranges from 6 μm to 8 μm, and a thickness of the photonic crystal layer ranges from 100 nm to 300 nm;

thicknesses of the inorganic layers in the first substrate structure layer 011 and the third substrate structure layer 013 both range from 700 nm to 900 nm, and a thickness of the inorganic layer in the second substrate structure layer ranges from 500 nm to 1500 nm.

Optionally, as illustrated in FIG. 2, the plurality of substrate structure layers are two substrate structure layers, and the two substrate structure layers include a first substrate structure layer 011 and a second substrate structure layer 012. The first substrate structure layer 011 includes the organic layer 0111, the inorganic layer 0112, and the photonic crystal layer 0113 that are superimposed, and the second substrate structure layer 012 includes the organic layer 0121 and the inorganic layer 0122 that are superimposed.

Persons of ordinary skill in the art can understand that all or part of the steps described in the above embodiments can be completed through hardware, or through relevant hardware instructed by applications stored in a non-transitory computer readable storage medium, such as a read-only memory, a disk or a CD, etc.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A flexible substrate, comprising:
a plurality of substrate structure layers that are superimposed, wherein at least one of the plurality of substrate structure layers comprises an organic layer, an inorganic layer and a photonic crystal layer that are superimposed,
wherein the plurality of substrate structure layers comprise: a first substrate structure layer and a second substrate structure layer which are located at outermost sides, and at least one third substrate structure layer located between the first substrate structure layer and the second substrate structure layer, wherein each of the first substrate structure layer and the third substrate structure comprises the organic layer, the inorganic layer, and the photonic crystal layer that are sequentially superimposed, and a photonic band gap of the photonic crystal layer in the first substrate structure layer is different from that of the photonic crystal layer in the third substrate structure layer.

2. The flexible substrate according to claim 1, wherein the photonic crystal layer is a two-dimensional photonic crystal layer.

3. The flexible substrate according to claim 1, wherein the photonic crystal layer has a plurality of through holes penetrating along a thickness direction of the photonic crystal layer.

4. The flexible substrate according to claim 3, wherein a shape of an opening surface of the through hole is a circle or a polygon.

5. The flexible substrate according to claim 3, wherein a shape of the opening surface of the through hole is a circle, and an aperture of the through hole ranges from 10 nm to 1000 nm.

6. The flexible substrate according to claim 3, wherein the through hole is provided with an organic material.

7. The flexible substrate according to claim 6, wherein the organic material is same as a material of the organic layer.

8. The flexible substrate according to claim 7, wherein the organic material is polyimide.

9. The flexible substrate according to claim 1, wherein materials of the inorganic layer and the photonic crystal layer are both silicon oxide.

10. The flexible substrate according to claim 1, wherein the second substrate structure layer comprises the organic layer and the inorganic layer that are superimposed.

11. The flexible substrate according to claim 1, wherein a thickness of the organic layer ranges from 6 μm to 8 μm, and a thickness of the photonic crystal layer ranges from 100 nm to 300 nm;
thicknesses of the inorganic layers in the first substrate structure layer and in the third substrate structure layer both range from 700 nm to 900 nm, and a thickness of the inorganic layer in the second substrate structure layer ranges from 500 nm to 1500 nm.

12. The flexible substrate according to claim 1, wherein the second substrate structure layer comprises the organic layer and the inorganic layer that are superimposed;

the photonic crystal layer is a two-dimensional photonic crystal layer, the photonic crystal layer has a plurality of through holes penetrating along a thickness direction of the photonic crystal layer, and polyimide is provided in the through holes, wherein a shape of an opening surface of the through hole is a circle or a polygon, and an aperture of the through hole ranges from 10 nm to 1000 nm when the shape of the opening surface of the through hole is a circle;

a thickness of the organic layer ranges from 6 μm to 8 μm, and a thickness of the photonic crystal layer ranges from 100 nm to 300 nm, a thickness of the inorganic layer in the first substrate structure layer ranges from 700 nm to 900 nm, and a thickness of the inorganic layer in the second substrate structure layer ranges from 500 nm to 1500 nm;

materials of the inorganic layer and the photonic crystal layer are both silicon oxide, and a material of the organic layer is polyimide.

13. A method of manufacturing a flexible substrate, comprising:

forming a plurality of substrate structure layers that are superimposed on a base substrate, wherein at least one of the plurality of substrate structure layers comprises an organic layer, an inorganic layer and a photonic crystal layer that are superimposed; and stripping the base substrate to obtain the flexible substrate, wherein the plurality of substrate structure layers comprise: a first substrate structure layer and a second substrate structure layer which are located at outermost sides, and at least one third substrate structure layer located between the first substrate structure layer and the second substrate structure layer, wherein each of the first substrate structure layer and the third substrate structure comprises the organic layer, the inorganic layer, and the photonic crystal layer that are sequentially superimposed, and a photonic band gap of the photonic crystal layer in the first substrate structure layer is different from that of the photonic crystal layer in the third substrate structure layer.

14. The method according to claim 13, wherein forming the plurality of substrate structure layers that are superimposed on the base substrate comprises:

forming an organic layer on the base substrate;

forming an inorganic mother layer on the base substrate on which the organic layer is formed; and processing the inorganic mother layer by a patterning process to obtain an inorganic layer and a photonic crystal layer, so as to obtain a first substrate structure layer, the photonic crystal layer having a plurality of through holes penetrating along a thickness direction of the photonic crystal layer.

15. The method according to claim 14, wherein forming the plurality of substrate structure layers that are superimposed on the base substrate further comprises:

filling the through holes of the photonic crystal layer with an organic material.

16. The method according to claim 15, wherein filling the through holes of the photonic crystal layer with the organic material comprises;

forming the second substrate structure layer on the base substrate on which the photonic crystal layer is formed, wherein the second substrate structure layer comprises an organic layer and an inorganic layer that are superimposed in a direction away from the base substrate, and a material of the organic layer is filled in the through holes of the photonic crystal layer.

17. A display device, comprising a flexible substrate, wherein the flexible substrate comprises a plurality of substrate structure layers that are superimposed, and at least one of the plurality of substrate structure layers comprises an organic layer, an inorganic layer and a photonic crystal layer that are superimposed, wherein the plurality of substrate structure layers comprise: a first substrate structure layer and a second substrate structure layer which are located at outermost sides, and at least one third substrate structure layer located between the first substrate structure layer and the second substrate structure layer, wherein each of the first substrate structure layer and the third substrate structure comprises the organic layer, the inorganic layer, and the photonic crystal layer that are sequentially superimposed, and a photonic band gap of the photonic crystal layer in the first substrate structure layer is different from that of the photonic crystal layer in the third substrate structure layer.

* * * * *